United States Patent [19]

Sferrazza et al.

[11] Patent Number: 5,526,392
[45] Date of Patent: Jun. 11, 1996

[54] METHOD OF SCALING THE OUTPUTS OF A BINARY COUNTER

[75] Inventors: Paul K. Sferrazza, Somerville; Joseph W. Harmon, East Brunswick, both of N.J.

[73] Assignee: Harris Corporation, Melbourne, Fla.

[21] Appl. No.: 395,590

[22] Filed: Feb. 28, 1995

[51] Int. Cl.[6] .................................................. H03K 21/38
[52] U.S. Cl. ............................. 377/108; 377/29; 377/111
[58] Field of Search .............................. 377/28, 29, 107, 377/108, 111, 47

[56] References Cited

U.S. PATENT DOCUMENTS

| | | | |
|---|---|---|---|
| 3,800,233 | 3/1974 | Sauthier | 377/28 |
| 3,967,205 | 6/1976 | Rossi et al. | 377/108 |
| 4,584,698 | 4/1986 | Sibigtroth et al. | 377/110 |
| 4,860,325 | 8/1989 | Aria et al. | 377/29 |
| 4,935,944 | 6/1990 | Everett | 377/108 |
| 4,991,186 | 2/1991 | Payen et al. | 377/28 |
| 5,029,191 | 7/1991 | Robbins | 377/111 |
| 5,381,453 | 1/1995 | Chan | 377/28 |

*Primary Examiner*—John S. Heyman
*Attorney, Agent, or Firm*—Rogers & Killeen

[57] ABSTRACT

A method and circuit for selectively scaling a binary counter having N serially connected stages in which an output count from the counter is $2^M$ times the number of clock signals that have been input to the counter. The first M stages of the counter are selectively held so that clock signals by-pass (or pass through) the first M stages without change. The M+1 stage receives each clock signal and is thereby caused to indicate that $2^M$ clock signals have been received, when only one clock signal has, in fact, been received. The output of each stage is provided to a decoder array that provides the scaled count signal. The method and circuit find application in systems in which normal unscaled operation of the binary counter may be selectively replaced with high speed operation, such as during tests or during special operating modes. The circuit and method obviate the need for a separate high speed clock, or for adaptive circuitry in the decoder array.

17 Claims, 1 Drawing Sheet

METHOD OF SCALING THE OUTPUTS OF A BINARY COUNTER

BACKGROUND OF THE INVENTION

The present invention relates to binary counters that provide a count signal indicating the number of clock signals that have been received, and more particularly to a method and circuit in which the count signal from a binary counter may be selectively scaled by a factor $2^M$ so that the count signal indicates that $2^M$ clock signals have been received for each single clock signal that has been received.

Binary counters find application in digital communication systems where a count of the number of clock signals received is used for various purposes by the system. Binary counters are well known and need not be discussed in detail for an understanding of the present invention. A binary counter provides an (unscaled) count signal indicating the number of clock signals received at the counter, and typically includes N serially connected stages, each for providing an output indicating its state has been changed. The clock signal may be provided synchronously, to all stages simultaneously so that counter output is always correct, or asynchronously, to the first stage so that the signal cascades through the stages and the counter output is only correct when the signal has cascaded to the last stage. Outputs from each stage are provided to a decoder array that provides a count signal. The decoder array may include AND or NAND gates where TRUE equals logic 1, or include OR or NOR gates where TRUE equals logic 0.

The count signal provided by a binary counter indicates the number of clock signals that have been received; each clock signal incrementing the count by one, and thus operating at the speed (frequency) of arrival of the clock signals. In some applications, it is desirable to have a binary counter selectively provide a count that is related to, but not the same as, the number of clock signals received. By way of example, a system may operate normally with a binary counter incrementing its count upon receipt of each clock signal. However, a test or special operating mode of the system may be at different speed (e.g., four times operational speed) so that the binary counter is to provide a count signal that indicates the count is higher than it actually is (four times higher in this example). Prior art systems have been adapted to operate at different speeds by providing a second clock for providing clock signals at the higher rate, or by adapting the decoder array with appropriate control signals and logic. As will be appreciated, these solutions may not be reasonable in all systems, may increase the number of discrete components (and real estate used) for integrated circuits, and may affect normal operation by adding circuitry used in the unscaled mode.

Accordingly, it is an object of the present invention to provide a novel method and device that obviates the problems of the prior art.

It is another object of the present invention to provide a novel method and device in which a scaled count is provided without using a second clock and without modifying the decoder array.

It is yet another object of the present invention to provide a novel method and device in which a scaled count is provided by adapting the N-stages of the counter so that the outputs from the stages indicate the scaled count.

It is still another object of the present invention to provide a novel method and device for providing a scaled count signal in which the first M stages of the N-stage counter are by-passed.

It is a further object of the present invention to provide a novel method and device for providing a scaled count signal in which both the Q and #Q outputs of the first M stages of the N-stage counter are set to true so that the M+1 stage indicates the $2^M$ clock signals have been received when only one has been received (#Q herein and QN in FIG. 2 indicating "Q not").

It is yet a further object of the present invention to provide a novel method and device for providing a count signal scaled by a factor of $2^M$ from an N-stage binary counter, where M is an integer less than N, in which Q and #Q outputs from M first stages of the counter are held so that they do not affect counter output, and in which a count signal from the counter indicates that the count is $2^M$ times the number of input clock signals received.

These and many other objects and advantages of the present invention will be readily apparent to one skilled in the art to which the invention pertains from a perusal of the claims, the appended drawings, and the following detailed description of the preferred embodiments.

DESCRIPTION OF PREFERRED EMBODIMENTS

Figure 1:
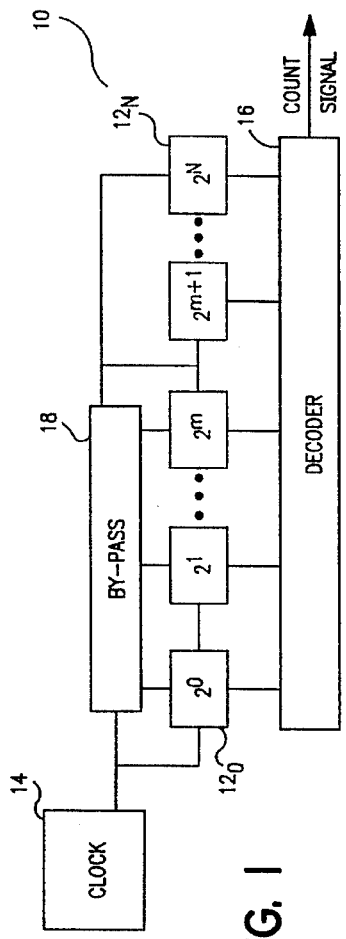
FIG. 1 is schematic diagram of an embodiment of the present invention.

With reference now to FIG. 1, an embodiment 10 of the present invention may include N serially connected stages $12_0, 12_1, \ldots, 12_N$ that may be connected to a source of clock signals 14 for either synchronous or asynchronous operation (asynchronous being shown). The stages 12 may be tripped and operated conventionally, and provide indications to a conventional decoder array 16 when a change of state has occurred. The change of state indications are tabulated in the decoder array 16 to provide a count signal.

The first M stages of the counter may include a circuit 18 for selectively by-passing the first M stages so that clock signals pass through, or by-pass, the first M stages without change. That is, the outputs of the first M stages are set so that the clock signals proceed to the M+1 stage. When the first M stages have been selectively by-passed, each clock signal trips the M+1 stage that indicates the $2^M$ clock signals have been received, when, in fact, only one clock signal has been received. Thus, the count signal from the decoder array 16 is scaled by a factor of $2^M$ so that the count signal indicates that $2^M$ times the number of clock signals that have been input to the counter 10. The number of by-passed stages M is an integer less than N. The extension of this method to synchronous counters will be apparent to those of skill in the art.

By way of example, a 9-bit counter (with 9 stages) may provide counts up to $2^9-1$, and if M is 2 the counter will count to $2^9-1$ by fours. The first two stages of the counter will be by-passed (the first stage being the least significant bit). This will result in the loss of some granularity (counts between $X2^M$ and $(X+1)2^M$ do not exist), but enables the counter to operate with inputs that arrive $2^M$ times more quickly than when the first M stages have not been by-passed.

This method and circuit may find application in systems in which normal unscaled operation of the binary counter may be selectively replaced with high speed operation, such as during tests or special operating modes where high speed operation does not degrade test or special operating mode functions. The circuit and method obviate the need for a separate high speed clock, or for adaptive circuitry in the decoder array.

In a preferred embodiment, the first M stages are held by forcing both the Q and #Q outputs from the by-passed stages to the TRUE state, where the TRUE state is determined by the nature of the decoder array. When the decoder array is implemented with AND or NAND gates, TRUE equals logic 1, and when the decoder array is implemented with OR or NOR gates, TRUE equals logic 0.

Figure 2:
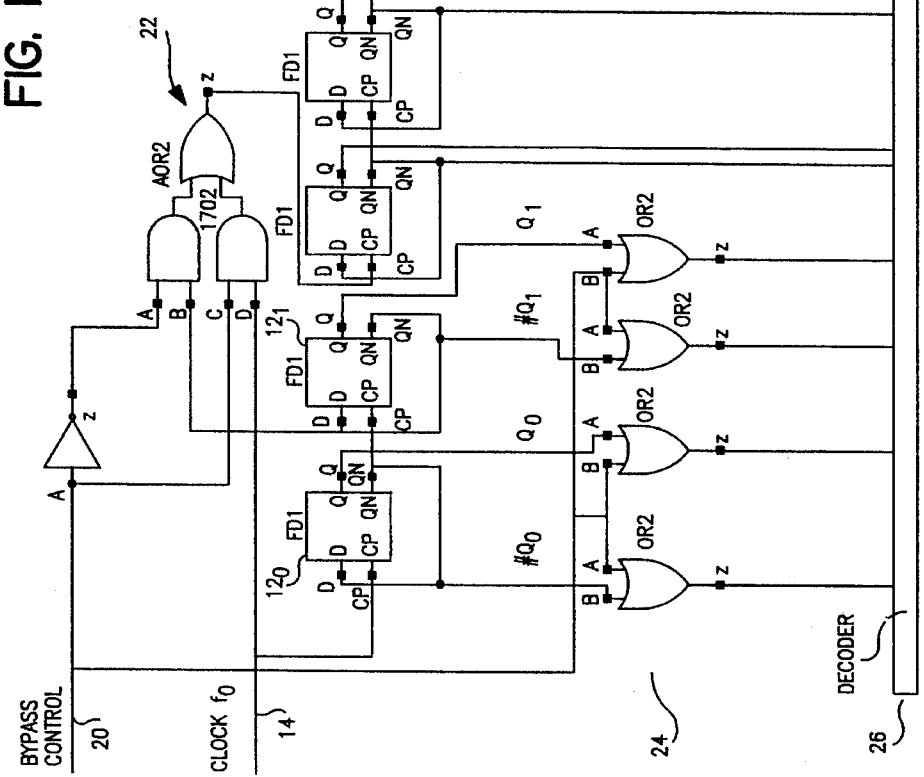
FIG. 2 is a circuit diagram of an embodiment of the present invention.

The circuitry for by-passing the first M stages depends on the types of flip-flops used in the stages, and will be apparent to one of skill in the art from a reading hereof, and by referring to the exemplary by-pass circuitry illustrated in FIG. 2. As shown therein, the circuitry for forcing M first stages (M being 2 in the embodiment of FIG. 2) may include a control signal 20 for enabling the by-pass circuitry 22 and the forcing circuitry 24. The circuit of FIG. 2 is for operation with a decoder 26 (not shown in detail) that has AND and NAND elements, with modifications for operation with a decoder that has OR and NOR elements being apparent to those of skill in the art.

When the control signal 20 is a logic 0 the nine stage counter comprised of $12_0$ through $12_8$ functions conventionally as an asynchronous binary counter. The forcing circuitry 24 is effectively disabled and passes the Q and #Q outputs of the first two stages $12_0$ and $12_1$ to the decoder without modification. A sequence of $2^N$ pulses on the clock signal 14 will result in all counts from 0 to $2^N-1$ being presented to the decoder at a rate $f_0$ where $f_0$ is the rate of the clock signal 14.

When the control signal 20 is a logic 1 the by-pass circuitry 22 applies the clock signal 14 directly to the third stage $12_2$ of the nine stage counter. Stages $12_2$ through $12_8$ function conventionally as an asynchronous seven stage binary counter. Stages $12_0$ and $12_1$ need not be clocked. In this example, stages $12_0$ and $12_1$ continue to be clocked in the same manner as when the control signal 20 is logic 0. The forcing circuitry 24 is enabled and holds the Q and #Q outputs of the first two stages $12_0$ and $12_1$ at a true level into the decoder 26. This eliminates the $12_0$ and $12_1$ terms from the Boolean equation of any decoded count. A sequence of $2^N/4$ pulses on the clock signal 14 will result in all counts of stages $12_2$ through $12_8$ which will be decoded within the decoder as all counts from 0 to $2^N-1$ counting by fours. A complete sequence of counts is generated with one-fourth of the pulses required when the control signal 20 is logic 0, effectively increasing the count frequency by a factor of four.

While preferred embodiments of the present invention have been described, it is to be understood that the embodiments described are illustrative only and the scope of the invention is to be defined solely by the appended claims when accorded a full range of equivalence, many variations and modifications naturally occurring to those of skill in the art from a perusal hereof.

What is claimed is:

1. A method of scaling an output from an N-stage binary counter by a factor of $2^M$, where M is an integer less than N, comprising the steps of:

(a) providing input clock signals to the counter;

(b) forcing outputs from M first stages of the counter so that they do not affect counter output; and (c) providing a count signal from the counter that indicates that the count is $2^M$ times the number of input clock signals.

2. The method of claim 1 wherein the outputs Q and #Q from each of the M first stages of the counter are forced to a true state.

3. The method of claim 1 further comprising the steps of providing outputs from the M+1 and subsequent stages to a decoder array for providing the count signal, and selectively providing a logic signal to force outputs Q and #Q from the M first stages of the counter to a state that does not affect the count from the decoder array.

4. A method of scaling an output from an N-stage binary counter by a factor of $2^M$, where each of the N stages has Q and #Q outputs and M is an integer less than N, comprising the steps of:

(a) providing input clock signals to the counter;

(b) forcing Q and #Q outputs from M first stages of the counter to a first logic state so that they do not affect counter output; and (c) providing a count signal from the counter that is scaled by a factor of $2^M$.

5. The method of claim 4 wherein the first logic state is true.

6. The method of claim 4 where N is 9 and M is 2.

7. The method of claim 4 further comprising the step of providing outputs from the M+1 and subsequent stages to a decoder array for providing the count signal.

8. The method of claim 4 wherein the decoder array comprises AND or NAND gates, and wherein the outputs Q and #Q from each of the M first stages of the counter are held in a logic one state.

9. The method of claim 4 wherein the decoder array comprises OR or NOR gates, and wherein the outputs Q and #Q from each of the M first stages of the counter are held in a logic zero state.

10. The method of claim 4 where the clock signals are provided synchronously at a frequency of $f_0$.

11. The method of claim 4 where the clock signals are provided asynchronously at a frequency of $f_0$.

12. A method of selectively operating a binary counter having N stages, each with Q and #Q outputs, so that an output count from the counter is $2^M$ times a number of input clock signals that have been input to the counter, the method comprising the steps of:

(a) selectively forcing the input clock signals to by-pass the first M stages of the counter so that the M+1 stage receives each input clock signal; and (b) indicating a count by providing signals from the M+1 and subsequent stages to a decoder array, wherein when the decoder array comprises AND or NAND gates, the outputs Q and #Q from each of the first M stages of the counter are held in a logic one state, and when the decoder array comprises OR or NOR gates, the outputs Q and #Q from each of the first M stages of the counter are held in a logic zero state.

13. The method of claim 12 further comprising the step of selectively providing a logic signal to force outputs Q and #Q from the M first stages of the counter to a state that does not affect the count from the decoder array.

14. The method of claim 13 wherein the logic signal forces input clock signals to the M+1 stage when the first M stages are by-passed.

15. A binary counter for selectively providing a scaled count signal where an unscaled count signal indicates the number of clock signals received at the counter, the counter comprising:

N serially connected stages, each of said stages for providing Q and #Q outputs indicating its state has been changed by a clock signal;

a decoder array for receiving the outputs from said stages and for providing a count signal;

means for selectively forcing the Q and #Q outputs of the first M of said stages to a true state so that a clock signal by-passes the first M stages without change, whereby when said first M stages are by-passed, said decoder array provides a count signal that is scaled by a factor of $2^M$.

16. The counter of claim 15 wherein said decoder array comprises AND or NAND gates, and wherein outputs Q and #Q from each of the first M stages are for being held in a logic one state when the first M stages are controlled.

17. The counter of claim 15 wherein said decoder array comprises OR or NOR gates, and wherein outputs Q and #Q from each of the first M stages are for being held in a logic zero state when the first M stages are controlled.

* * * * *